US012812818B2

(12) United States Patent
Jiao et al.

(10) Patent No.: US 12,812,818 B2
(45) Date of Patent: Nov. 24, 2026

(54) COOLING MODULE AND COMPUTING DEVICE

(71) Applicant: HUAWEI TECHNOLOGIES CO., LTD., Shenzhen (CN)

(72) Inventors: Zelong Jiao, Beijing (CN); Lujun Zhou, Nanjing (CN); Guangming Zheng, Dongguan (CN); Fei Ma, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 328 days.

(21) Appl. No.: 18/758,053

(22) Filed: Jun. 28, 2024

(65) Prior Publication Data

US 2024/0357773 A1 Oct. 24, 2024

Related U.S. Application Data

(63) Continuation of application No. PCT/CN2022/142913, filed on Dec. 28, 2022.

(30) Foreign Application Priority Data

Dec. 31, 2021 (CN) ......................... 202111676945.1

(51) Int. Cl.
*H05K 7/20* (2006.01)

(52) U.S. Cl.
CPC ..... *H05K 7/20772* (2013.01); *H05K 7/20254* (2013.01); *H05K 7/20263* (2013.01); *H05K 7/20272* (2013.01); *H05K 7/20727* (2013.01)

(58) Field of Classification Search
CPC ................. H05K 7/20; H05K 7/20254; H05K 7/20263; H05K 7/20272; H05K 7/20709;
(Continued)

(56) References Cited

U.S. PATENT DOCUMENTS

2004/0221604 A1* 11/2004 Ota .................... H05K 7/20781 361/691
2016/0120059 A1 4/2016 Shedd et al.
(Continued)

FOREIGN PATENT DOCUMENTS

CN 204377302 U 6/2015
CN 111465274 A 7/2020
(Continued)

OTHER PUBLICATIONS

PCT International Search Report for PCT/CN2022/142913 dated Dec. 28, 2022, 9 pages.

*Primary Examiner* — Amir A Jalali

(57) ABSTRACT

The technology of this application relates to, at least, a cooling module. The cooling module includes a liquid mixing cavity, a first and a second cooling plate. The first cooling plate is disposed on a side of a first chip and is fastened to the first chip. The second cooling plate is disposed on a side of a second chip and is fastened to the second chip. A temperature of the first chip is not equal to a temperature of the second chip. A flow channel is provided in each of the first cooling plate and the second cooling plate. The first cooling plate and the second cooling plate are each provided with a liquid outlet and a liquid return opening that are communicated with the flow channel. Both the liquid outlet and the liquid return opening are communicated with the liquid mixing cavity. A liquid medium flows between the flow channel and the liquid mixing cavity.

20 Claims, 11 Drawing Sheets

(58) Field of Classification Search
CPC ........... H05K 7/20718; H05K 7/20727; H05K 7/20763; H05K 7/20772; H05K 7/20781; H05K 7/20809; H05K 7/20818; Y02D 10/00
See application file for complete search history.

(56) References Cited

U.S. PATENT DOCUMENTS

| | | | | |
|---|---|---|---|---|
| 2017/0303440 | A1* | 10/2017 | Shimasaki ......... | H05K 7/20254 |
| 2020/0404812 | A1* | 12/2020 | Gao .................. | H05K 7/20272 |
| 2022/0201896 | A1* | 6/2022 | Edmunds ........... | H05K 7/20272 |
| 2022/0287204 | A1* | 9/2022 | Takashima ......... | H05K 7/20263 |
| 2024/0324146 | A1* | 9/2024 | Jia ...................... | H05K 7/20272 |

FOREIGN PATENT DOCUMENTS

| | | | |
|---|---|---|---|
| EP | 3417684 | B1 | 6/2020 |
| JP | 2013065227 | A | 4/2013 |
| WO | 2020181953 | A1 | 9/2020 |

* cited by examiner

COOLING MODULE AND COMPUTING DEVICE

CROSS-REFERENCE TO RELATED APPLICATIONS

This application is a continuation of International Application No. PCT/CN2022/142913, filed on Dec. 28, 2022, which claims priority to Chinese Patent Application No. 202111676945.1, filed on Dec. 31, 2021. The disclosures of the aforementioned applications are hereby incorporated by reference in their entireties.

TECHNICAL FIELD

Embodiments of this application relate to the field of technologies for cooling computing devices, and in particular, to a cooling module, and further to a computing device that may include a cooling module.

BACKGROUND

With the development of technologies in the computer field, a larger quantity of large-scale computing devices are deployed, and a computing device uses a chassis to place a plurality of boards integrated with chips. Currently, because a larger quantity of highly integrated high-power-consumption chips are used in computing devices, more heat is generated in a running process of the chips. As a result, a cooling requirement of the computing devices is increasingly high.

FIG. 1 shows an existing computing device that includes a cooling structure. Specifically, the computing device includes a chassis 01. A plurality of slots for installing boards are provided inside the chassis 01 in a preset direction. FIG. 1 shows an example of a first board 021 and a second board 022 that are installed in corresponding slots. In addition, a fan 03 that is used as the cooling structure is further disposed inside the chassis 01. In other words, in the structure shown in FIG. 1, air is used as a heat transfer medium, and heat dissipated by a heat source chip 04 on a board is conducted to the outside of the chassis 01 by using the fan 03, so that the chip 04 is cooled.

In the structure shown in FIG. 1, a cooling capability of any board is mainly limited by a space volume of a slot and a cooling capability of the fan 03. To improve cooling effect of the board, the slot volume may be increased, or the cooling effect of the fan 03 may be enhanced. However, during specific implementation, there is a design standard for the slot volume. In this case, cooling of the board can be enhanced only through improvement on the cooling capability of the fan 03. Therefore, the cooling capability of any board in FIG. 1 highly depends on the cooling capability of the fan 03. However, there is almost no room for a higher cooling capability of the existing fan, limiting the cooling effect of the board.

SUMMARY

This application provides a cooling module and a computing device that includes the cooling module, to implement cross heat exchange between chips, thereby implementing temperature equalization.

To achieve the foregoing objective, the following technical solutions are used in embodiments of this application.

According to a first aspect, this application provides a computing device. The computing device may be a data center, a server, or another interconnected computing device.

The computing device includes a chassis, a first chip, a second chip, and a cooling module. The cooling module is configured to cool the first chip and the second chip. Both the first chip and the second chip are disposed inside the chassis. The cooling module includes a liquid mixing cavity, a first cooling plate, and a second cooling plate. The first cooling plate is disposed on a side of the first chip and is fastened to the first chip. The second cooling plate is disposed on a side of the second chip and is fastened to the second chip. A temperature of the first chip is not equal to a temperature of the second chip. A flow channel is provided in each of the first cooling plate and the second cooling plate. The first cooling plate and the second cooling plate are each provided with a liquid outlet and a liquid return opening that are communicated with the flow channel. Both the liquid outlet and the liquid return opening are communicated with the liquid mixing cavity. A liquid medium flows between the flow channel and the liquid mixing cavity.

The computing device provided in this application includes the liquid mixing cavity. In addition, the flow channel communicated with the liquid mixing cavity is formed in either of the first cooling plate and the second cooling plate. In this way, for example, when the first chip is a heat source that consumes higher power and dissipates much heat, and the second chip is a heat source that consumes lower power and dissipates less heat than the first chip, some heat dissipated by the high-power-consumption chip is transferred to the liquid mixing cavity via the liquid medium flowing in the flow channel, and some heat dissipated by the low-power-consumption chip is also transferred to the liquid mixing cavity via the liquid medium flowing in the flow channel. Then, the two liquid media with different temperatures are mixed in the liquid mixing cavity, and a mixed liquid medium may flow into the flow channel of the low-power-consumption chip. That is, heat is diffused by using the cooling module on the low-temperature low-power-consumption chip, so that the high-power-consumption chip is cooled, and the temperature of the high-power-consumption chip and the temperature of the low-power-consumption chip are equalized.

In other words, in the computing device provided in this application, heat is diffused by using the cooling module disposed on the chip (this cooling manner may be referred to as local cooling), the liquid medium in the cooling plate may also conduct some heat into the liquid mixing cavity, to be mixed with the liquid medium conveyed by the other chip, so that the mixed liquid medium is conveyed into the flow channel of the cooling plate corresponding to the other chip. That is, cooling is performed by using the other cooling plate (this cooling manner may be referred to as remote cooling). Therefore, the temperatures of the chips are equalized, and a cooling system forms a mutual assistance cooling system.

In addition, in the computing device, the flow channel is communicated with the liquid mixing cavity through the liquid outlet and the liquid return opening. That is, the liquid medium continuously circulates between the liquid mixing cavity and the flow channel of the cooling plate. In this way, the chip is continuously cooled. This can promote continuous evolution of the chip.

In a possible implementation, the liquid mixing cavity is disposed inside the chassis, or the liquid mixing cavity is disposed outside the chassis.

A specific disposing position of the liquid mixing cavity may be set based on an actual requirement.

In a possible implementation, the chassis is provided with a first slot and a second slot. The first chip and the first cooling plate are disposed in the first slot in a pluggable manner. The second chip and the second cooling plate are disposed in the second slot in a pluggable manner.

In a possible implementation, the computing device further includes a fan. The fan is disposed inside the chassis. An air exhaust side of the fan is communicated with the outside of the chassis.

If the fan is added, the cooling system of the computing device includes the foregoing local cooling and remote cooling, and also includes cooling by using air as a heat transfer medium. In this way, cooling effect is further improved, and a favorable condition is provided for evolution of the chip.

According to a second aspect, this application provides a cooling module. The cooling module may be disposed in the computing device in the first aspect.

The cooling module includes a liquid mixing cavity, a first cooling plate, and a second cooling plate. The first cooling plate is configured to be disposed on a side of a first chip and is fastened to the first chip. The second cooling plate is configured to be disposed on a side of a second chip and is fastened to the second chip. A temperature of the first chip is not equal to a temperature of the second chip. A flow channel is provided in each of the first cooling plate and the second cooling plate. The first cooling plate and the second cooling plate are each provided with a liquid outlet and a liquid return opening that are communicated with the flow channel. Both the liquid outlet and the liquid return opening are communicated with the liquid mixing cavity. A liquid medium flows between the flow channel and the liquid mixing cavity.

As described in the computing device in the foregoing embodiment, the cooling module includes the liquid mixing cavity. In addition, the flow channel communicated with the liquid mixing cavity is formed in either of the first cooling plate and the second cooling plate. In this way, for example, when the first chip is a heat source that consumes higher power and dissipates much heat, and the second chip is a heat source that consumes lower power and dissipates less heat than the first chip, some heat dissipated by the high-power-consumption chip is transferred to the liquid mixing cavity via the liquid medium flowing in the flow channel, and some heat dissipated by the low-power-consumption chip is also transferred to the liquid mixing cavity via the liquid medium flowing in the flow channel. Then, the two liquid media with different temperatures are mixed in the liquid mixing cavity, and a mixed liquid medium may flow into the flow channel of the low-power-consumption chip. That is, heat is diffused by using the cooling module on the low-temperature low-power-consumption chip, so that the high-power-consumption chip is cooled, and the temperature of the high-power-consumption chip and the temperature of the low-power-consumption chip are equalized.

In a possible implementation, the cooling module further includes at least one drive pump. The flow channel in either of the first cooling plate and the second cooling plate is communicated with the liquid mixing cavity through the drive pump.

The liquid medium flowing between the flow channel and the liquid mixing cavity may be driven by the drive pump to quickly convey, to the liquid mixing cavity, the liquid medium that is in the flow channel and that carries a large amount of heat. This implements cross heat exchange and improves heat exchange efficiency.

In a possible implementation, a partition plate is disposed in the liquid mixing cavity. The partition plate divides the liquid mixing cavity into at least two communicated channels.

Because the partition plate is disposed in the liquid mixing cavity, the at least two communicated channels are formed. In this way, flow paths may be added for the liquid medium conveyed from the first cooling plate and the liquid medium conveyed from the second cooling plate, so that the liquid media conveyed from the two cooling plates are fully mixed.

In a possible implementation, the first cooling plate and the second cooling plate are arranged in a first direction. A first liquid inlet and a second liquid inlet that are communicated with the liquid mixing cavity are provided on a wall surface of the liquid mixing cavity. The first liquid inlet and the second liquid inlet are arranged in the first direction. The first liquid inlet is communicated with a liquid outlet of the first cooling plate. The second liquid inlet is communicated with a liquid outlet of the second cooling plate. The partition plate extends in the first direction. A liquid-through hole through which two adjacent channels are communicated with each other is provided in the partition plate. The liquid-through hole is provided at a position between the first liquid inlet and the second liquid inlet.

In this implementation, the liquid medium flowing into the first liquid inlet and the liquid medium flowing into the second liquid inlet can also be fully mixed. This improves temperature equalization effect on the chip.

In this implementable embodiment, because the first liquid mixing cavity and the second liquid mixing cavity that are communicated with each other are included, a structure formed in this way may be referred to as multi-level liquid mixing. Through multi-level liquid mixing, a degree of mixing the liquid media with different temperatures can be improved, to improve temperature equalization effect.

In a possible implementation, the liquid mixing cavity includes the first liquid mixing cavity and the second liquid mixing cavity. The first liquid mixing cavity is communicated with the liquid outlet. The second liquid mixing cavity is communicated with the liquid return opening. The first liquid mixing cavity and the second liquid mixing cavity are communicated with each other through communication pipes.

In a possible implementation, in the first liquid mixing cavity, a quantity of liquid inlets configured to be communicated with the flow channel is greater than a quantity of liquid outlets configured to be communicated with the second liquid mixing cavity. The cooling module further includes a plurality of drive pumps. Any one of the communication pipes is communicated with one of the drive pumps.

In this way, a quantity of drive pumps can be reduced, energy consumption of the entire cooling module can be reduced, and manufacturing costs can be reduced.

In a possible implementation, the cooling module further includes a first vapor chamber. The first vapor chamber is disposed closer to the first chip than the first cooling plate. The first cooling plate is disposed on a side surface that is of the first vapor chamber and that is away from the first chip.

The vapor chamber is added, so that a heat conduction area can be increased. In other words, heat dissipated by the chips is first equalized by using the vapor chamber, and then conducted to the first cooling plate. In this way, cooling efficiency can be further improved.

The vapor chamber is a copper plate, an aluminum plate, or another plate structure with high thermal conductivity. The vapor chamber may alternatively be a plate structure in which a heat pipe is disposed, or the vapor chamber may be a VC vapor chamber.

In a possible implementation, an orthographic projection of the first cooling plate on the first vapor chamber is located within an edge of the first vapor chamber. The side surface that is of the first vapor chamber and that is away from the first chip and a side surface that is of the first cooling plate and that is away from the first vapor chamber are each provided with a plurality of first cooling fins at intervals.

In other words, an area of the cooling plate is less than an area of the vapor chamber. An advantage of such a design is that a transfer path of heat of local cooling can be shortened, so that local cooling can be fully utilized, and the cooling plate remotely transfers the heat of the chip to the liquid mixing cavity, so that a flow requirement of the liquid medium can be minimized. This reduces a requirement for a pump, reduces implementation difficulty of the cooling system, and reduces costs.

In a possible implementation, an orthographic projection of the first chip on the first vapor chamber is located within an edge of the first vapor chamber.

In other words, an area of the vapor chamber is greater than an area of the chip. In this way, heat dissipated by the chip can be diffused by using the vapor chamber with a large area. This improves cooling effect.

In a possible implementation, the cooling module further includes a first vapor chamber. The first cooling plate is disposed closer to the first chip than the first vapor chamber. The first vapor chamber is disposed on a side surface that is of the first cooling plate and that is away from the first chip. A side surface that is of the first vapor chamber and that is away from the first cooling plate is provided with a plurality of first cooling fins at intervals.

In this embodiment, the cooling plate is closer to the chip than the vapor chamber. In this way, heat dissipated by the chip is conducted to the liquid medium in the cooling plate, and the liquid medium carries the heat into the liquid mixing cavity. In addition, some heat is conducted to the vapor chamber and the first cooling fins by using the cooling plate, to implement local cooling.

In a possible implementation, at least one of the first cooling plate and the second cooling plate is a cold plate.

A liquid accommodating cavity is provided in the cold plate. A plurality of second cooling fins are disposed in the liquid accommodating cavity. The liquid accommodating cavity forms the flow channel. The liquid outlet and the liquid return opening are provided on opposite side surfaces of the cold plate.

It may be understood that in the cold plate provided as the cooling plate in this embodiment, because the plurality of second cooling fins are further disposed in the liquid accommodating cavity that forms the flow channel in the cold plate, the plurality of second cooling fins and the plurality of first cooling fins may be used as a local cooling structure to diffuse some heat dissipated by the chip, and the remaining heat is conducted to the outside via the liquid medium in the cold plate.

In a possible implementation, a thermal interface material (TIM) layer is disposed on an interface that is of the first vapor chamber and that is in contact with the first chip.

The thermal interface material layer is disposed, so that resistance can be reduced, and cooling effect is further improved.

In a possible implementation, the cooling module further includes a heat exchange plate. A fluid cavity is formed in the heat exchange plate. The heat exchange plate is provided with a liquid outlet and a liquid return opening that are communicated with the fluid cavity. Both the liquid outlet and the liquid return opening of the heat exchange plate are communicated with the liquid mixing cavity.

It may be understood in this embodiment that, when the computing device is provided with the first slot, the second slot, and the third slot, the first chip is installed in the first slot, the second chip is installed in the second slot, but no chip is installed in the third slot. Such a scenario belongs to a non-full configuration scenario. In the non-full configuration scenario, the heat exchange plate is disposed in the slot in which no chip is disposed, so that the liquid medium in the liquid mixing cavity can flow to the fluid cavity of the heat exchange plate. That is, heat is diffused by using the heat exchange plate. In this way, cooling effect on the first chip and the second chip can be further improved. In other words, a remote cooling path is added. For example, the first chip may be cooled by using the second chip, or may be cooled by using the heat exchange plate.

In a possible implementation, the cooling module further includes a plurality of third cooling fins. The plurality of third cooling fins are disposed on the heat exchange plate at intervals.

The plurality of third cooling fins are added, so that heat conducted to the heat exchange plate may be transferred to the outside by using the plurality of third cooling fins, to further improve cooling efficiency of the first chip and the second chip.

In a possible implementation, the heat exchange plate may be of a cold plate structure. The liquid accommodating cavity is disposed in the cold plate. The plurality of second cooling fins are disposed in the liquid accommodating cavity. The liquid accommodating cavity forms the fluid cavity.

In a possible implementation, the cooling module further includes a mounting plate. The heat exchange plate is fastened to the mounting plate. The mounting plate is disposed in the computing device in a pluggable manner.

The heat exchange plate is fastened to the mounting plate. The mounting plate is disposed in the computing device in a pluggable manner. For example, the mounting plate is installed in the third slot of the computing device in a pluggable manner. When a chip needs to be installed in the third slot, the heat exchange plate and the mounting plate may be removed and replaced with a chip structure. In this way, the computing device can be configured in a full configuration scenario.

In a possible implementation, the mounting plate includes a first plate, a second plate, and a connection plate. The first plate and the second plate are parallel to each other, and extend in a plug-in and plug-out direction in the computing device. The connection plate is configured to block a slot opening of a slot, and connect the first plate and the second plate. The heat exchange plate is disposed on a side surface that is of the first plate and that is opposite to the second plate.

The first plate is used as a bearing plate. The heat exchange plate is disposed on the first plate. In addition, the connection plate is disposed at the slot opening of the slot. Due to such a design, the connection plate may be used to seal the slot opening, to avoid that electromagnetic waves radiate into the chip of the computing device and affect operating performance of the chip.

REFERENCE NUMERALS

100: computing device;
01: chassis;
02: board; 021: first board; 022: second board;
02*a*: cooling plate assembly; 02*b*: chip; 02*c*: circuit board; 02*d*: mounting plate; 02*e*: flow channel;
02*a*1: cooling plate; 02*a*11: liquid accommodating cavity; 02*a*12: second cooling fins; 02*a*13: first opening; 02*a*14: second opening;
02*a*2: vapor chamber;
02*a*3: first cooling fin;
02*d*1: connection plate; 02*d*2: second plate; 02*d*3: first plate;
03: fan;
04: slot; 041: first slot; 042: second slot; 043: third slot;
051: first liquid inlet pipe; 052: first liquid return pipe;
06: liquid mixing cavity; 06*a*: first channel; 06*b*: second channel;
061: first liquid mixing cavity; 062: second liquid mixing cavity;
07: partition plate; 071: liquid-through hole;
081: first liquid inlet; 082: second liquid inlet;
09: drive pump;
10: heat exchange module; 101: heat exchange plate; 102: third cooling fin; 103: second liquid inlet pipe; 104: second liquid return pipe; 104: mounting plate; 105: fluid cavity;
11: liquid cooling connector;
12: first circuit board;
13: second circuit board.

DESCRIPTION OF EMBODIMENTS

An embodiment of this application provides a computing device. For example, the computing device may be a communication device, or may be another computing device, for example, may include a server, may be a data center, or may be another interconnection communication device.

Figure 1:
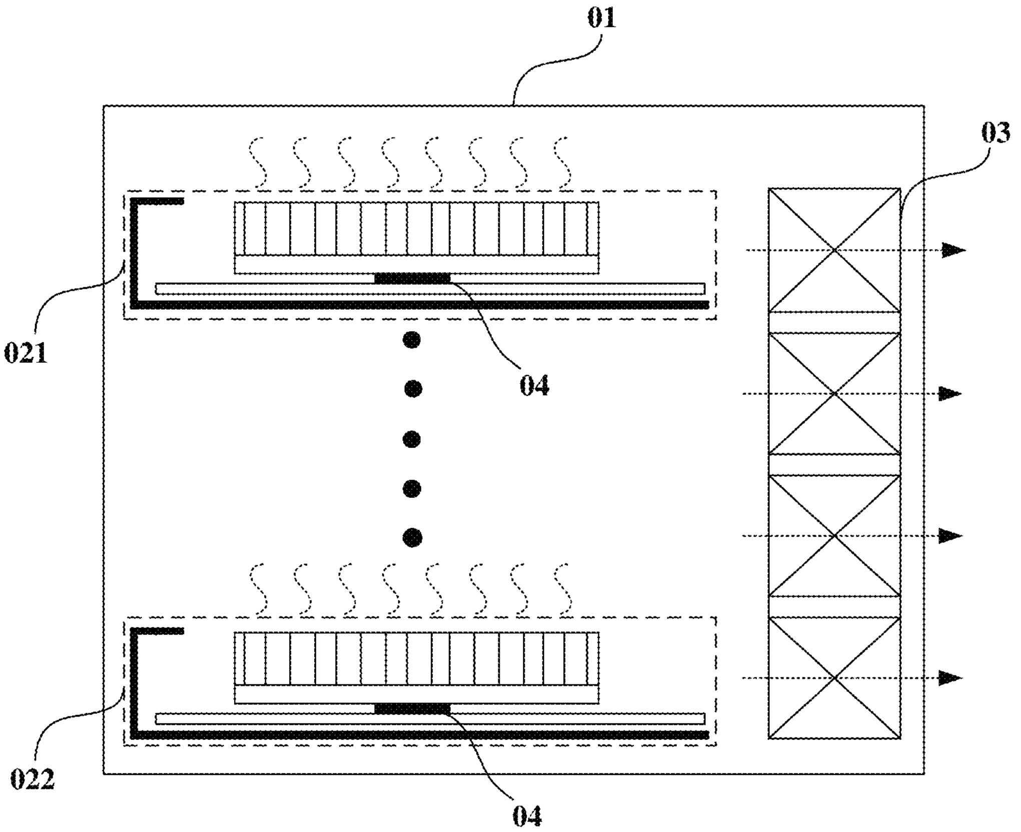
FIG. 1 is a diagram of a partial structure of an example computing device in a conventional technology.
Figure 2:
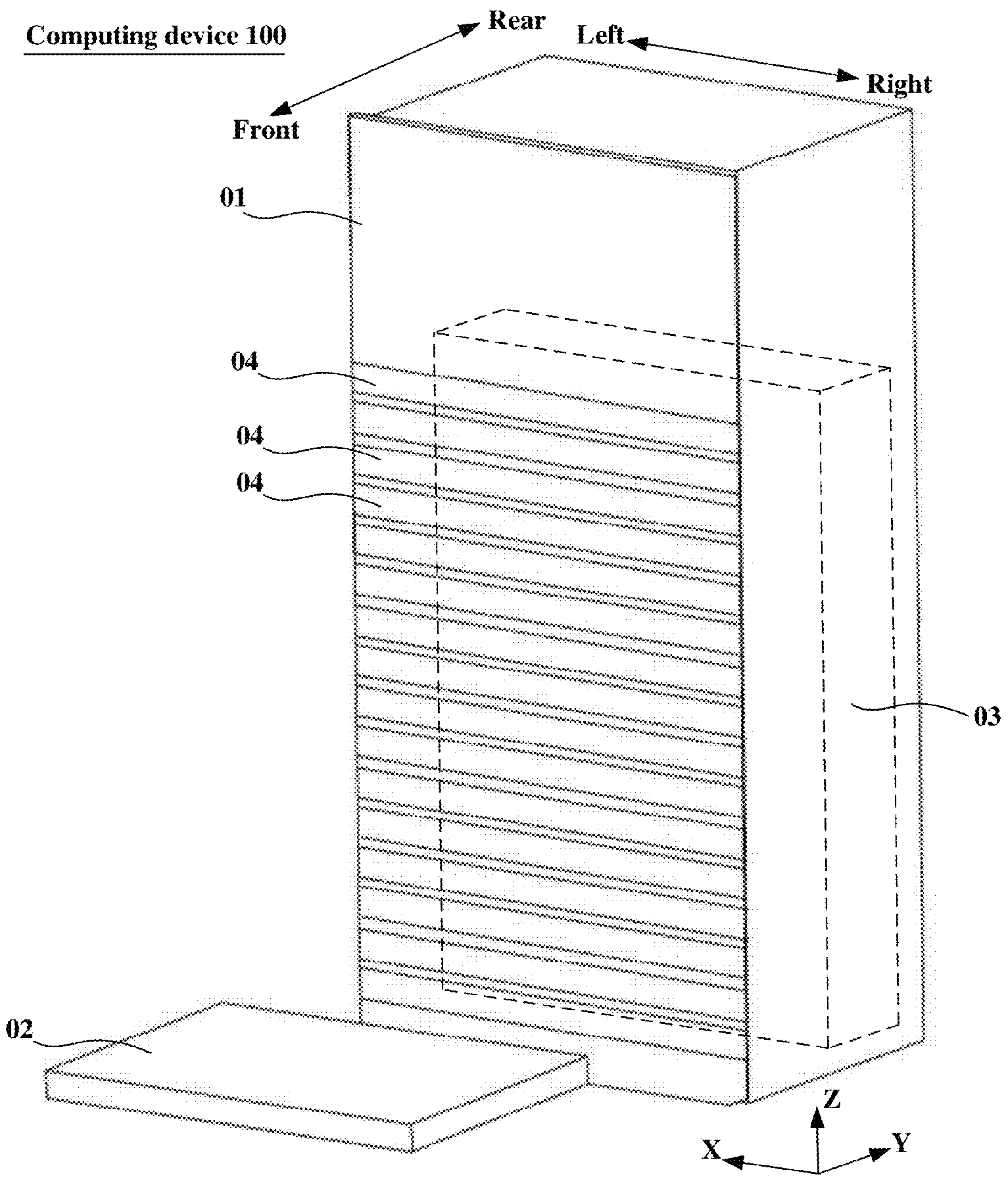
FIG. 2 is an exploded view of a computing device according to an example embodiment of this application.

FIG. 2 is an exploded view of a partial structure of a computing device in a conventional technology. The computing device 100 includes a chassis 01. A plurality of slots 04 are provided inside the chassis 01 in a preset direction. For example, FIG. 2 shows that the plurality of slots 04 are arranged in a height direction (for example, a Z direction in FIG. 2) of the chassis 01. In an implementable structure, a plurality of boards may be disposed inside the chassis 01 at intervals, and space formed between two adjacent boards may be referred to as a slot 04.

Still as shown in FIG. 2, the slot 04 inside the chassis 01 is for inserting a board 02. FIG. 2 shows a diagram of a structure in which the board 02 is removed from the slot 04. During specific operation, the board 02 is inserted into the slot 04 in a direction from the front to the rear of the chassis 01.

The board 02 includes at least a chip. In some optional implementations, the chip may be a die, for example, includes a die, or includes a plurality of three-dimensional stacked dies. In some other optional implementations, the chip may alternatively be a chip package structure. In other words, when the chip is the chip package structure, in addition to a die, the chip further includes a package substrate for bearing the die. In this case, a specific form of the chip is not specifically limited in this application.

When the chip in the board 02 operates, the chip dissipates heat. A cooling structure needs to be disposed inside the chassis 01 to enable the chip to properly run. For example, in the structure shown in FIG. 2, a fan 03 is disposed inside the chassis 01. The fan 03 drives air to flow, and the heat dissipated by the chip is diffused to the outside of the chassis 01 via the flowing air, to reduce the operating temperature of the chip. In some implementations, as shown in FIG. 2, the fan 03 is disposed at a position that is inside the chassis 01 and that is close to the rear.

To prevent the fan 03 from restricting high-power-consumption development of the chip, this application provides a new chip cooling method. The following describes in detail, with reference to the accompanying drawings, a structure and a cooling principle that are related to the new cooling method in this application.

Figure 3:
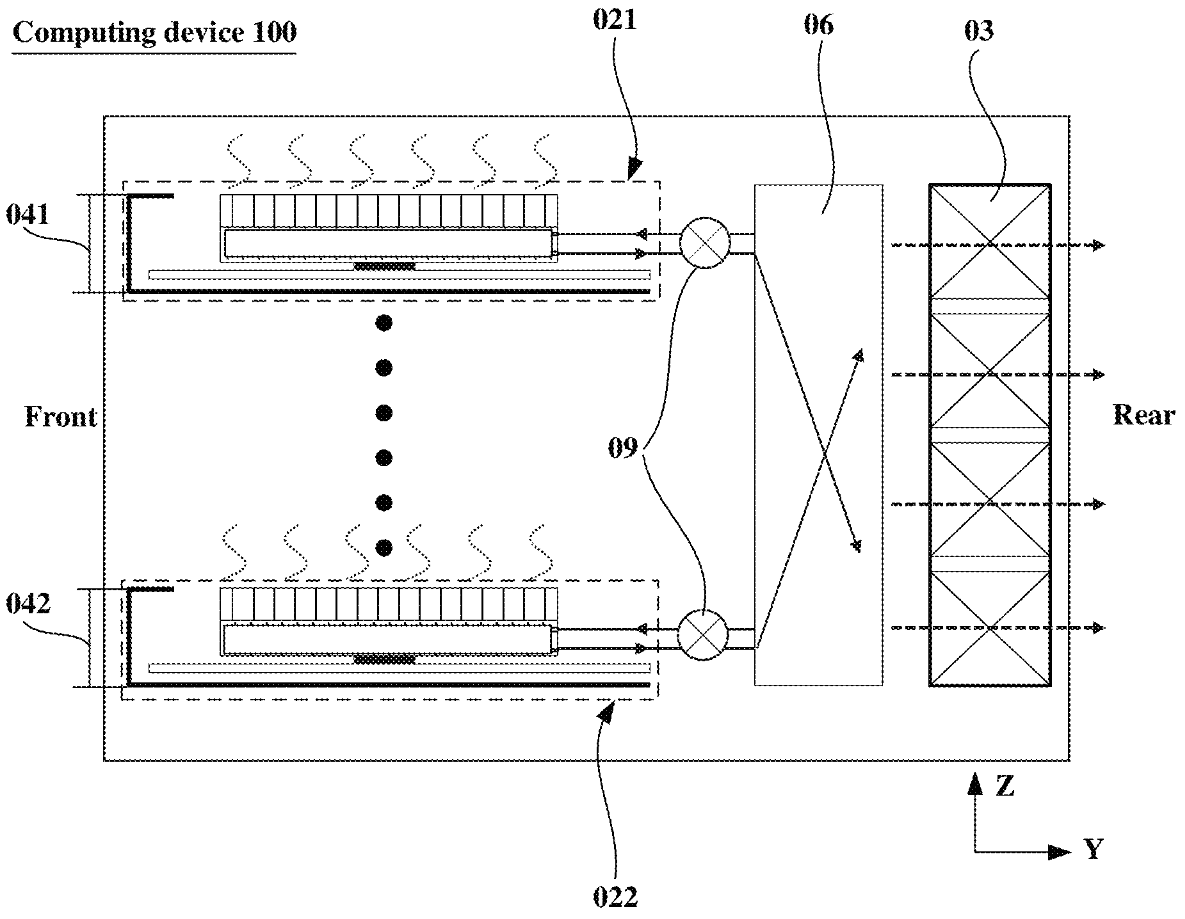
FIG. 3 is a diagram of a structure of a computing device according to an example embodiment of this application.

FIG. 3 is a diagram of a structure of a computing device according to an embodiment of this application. FIG. 3 is a diagram of a structure from the right to the left shown in FIG. 2. In FIG. 3, a first slot 041 and a second slot 042 inside the chassis 01 are drawn as an example, a first board 021 is inserted into the first slot 041, and a second board 022 is inserted into the second slot 042. Certainly, in addition to the first slot 041 and the second slot 042, more slots may be included. If a board is inserted into each slot other than the first slot 041 and the second slot 042, the computing device is in a full configuration scenario. If no board is inserted into some slots, the computing device is in a non-full configuration scenario. During specific implementation, a quantity of inserted boards needs to be determined based on an actual requirement. A quantity and an arrangement direction of inserted boards are not specially limited in this application.

Figure 4:
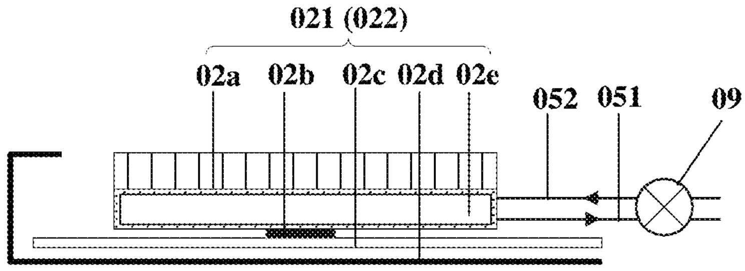
FIG. 4 is a diagram of a structure of a board in a computing device according to an example embodiment of this application.

FIG. 4 is a diagram of an implementable structure of the first board 021 or the second board 022. As shown in FIG. 4, either of the first board 021 and the second board 022 includes a mounting plate 02*d*. A mounting cavity is formed in the mounting plate 02*d*. A circuit board 02*c*, a chip 02*b*, and a cooling plate assembly 02*a* are disposed in the mounting cavity. The chip 02*b* is integrated on the circuit board 02*c*. The cooling plate assembly 02*a* is disposed on a side that is of the chip 02*b* and that is away from the circuit board 02*c*. Another electronic component, for example, a capacitor, an inductor, or a resistor, may be further integrated on the circuit board 02*c*. In the structure shown in FIG. 4, because the cooling plate assembly 02*a* is disposed on the chip 02*b*, some heat dissipated by the chip 02*b* may be diffused by using the cooling plate assembly 02*a*. During specific implementation, the mounting plate 02*d* provided with the circuit board 02*c*, the chip 02*b*, and the cooling plate assembly 02*a* may be inserted into a corresponding slot in a direction from the front to the rear.

The circuit board 02*c* in this application may be a printed circuit board (PCB). A structure form that may be selected for the chip 02*b* has been explained above.

Still refer to FIG. 3 and FIG. 4. In addition to the board and the fan 03, the computing device 100 further includes a liquid mixing cavity 06. In an implementation, the liquid mixing cavity 06 may be formed by using a hollow housing structure. That is, the hollow housing structure forms the liquid mixing cavity 06.

Refer to FIG. 3 and FIG. 4 together. A flow channel 02*e* is formed in the cooling plate assembly 02*a* of the board. The flow channel 02*e* is communicated with the liquid mixing cavity 06 through a first liquid inlet pipe 051 and a first liquid return pipe 052. A liquid medium, for example, water or another liquid medium with a high specific heat capacity, may flow in the flow channel 02*e*. In this way, some heat dissipated by the chip in the first board 021 may be conducted into the liquid mixing cavity 06 via the liquid medium. Similarly, some heat dissipated by the chip in the second board 022 may also be conducted into the liquid mixing cavity 06 via the liquid medium. The liquid media flowing into the liquid mixing cavity 06 may be mixed, and a mixed liquid medium may return to the flow channel of each board.

The chip in the first board 021 may be referred to as a first chip. The chip in the second board 022 may be referred to as a second chip.

When the computing device 100 is specifically used, power consumption of the chip in the first board 021 may be inconsistent with power consumption of the chip in the second board 022. For example, the chip in the first board 021 may be a high-power-consumption chip, and the chip in the second board 022 may be a low-power-consumption chip. In this way, the high-power-consumption chip dissipates more heat than the low-power-consumption chip, the liquid medium in the flow channel 02*e* of the first board 021 carries more heat and flows into the liquid mixing cavity 06, and the liquid medium in the flow channel 02*e* of the second board 022 carries less heat and flows into the liquid mixing cavity 06. The liquid media with two different temperatures are mixed in the liquid mixing cavity, and the mixed liquid medium may flow back into the flow channels 02*e* of the first board 021 and the second board. In this case, heat dissipated by the high-power-consumption chip in the first board 021 may be transferred to the flow channel 02*e* corresponding to the low-power-consumption chip in the second board 022 after passing through the liquid mixing cavity 06, and diffused to the outside by using the second board 022.

Based on the foregoing description of the cooling structure of the chip in the board and the description of the cooling process, it is easy to learn that the cooling method of the chip in each board includes at least local cooling and remote cooling. In local cooling, cooling is performed by using the cooling plate assembly 02*a* that covers one side of the chip, so that the chip is cooled. In remote cooling, heat dissipated by one chip is transferred to another chip, that is, is transferred to a cooling plate assembly corresponding to the chip on another board, and the heat is diffused to the outside by using the another cooling plate assembly, so that temperatures of a plurality of corresponding chips on a plurality of boards are equalized. A remote cooling medium is a liquid medium flowing between the flow channel 02*e* and the liquid mixing cavity 06.

A liquid medium that carries heat in each board flows into the liquid mixing cavity 06, and after being mixed in the liquid mixing cavity 06, the liquid medium returns to each board. Therefore, the liquid mixing cavity 06 may be used as an exchange channel of the liquid medium. In some other implementations, heat dissipated by the liquid medium in the liquid mixing cavity 06 may alternatively be partially diffused by using the liquid mixing cavity. Therefore, heat conducted to other boards is further reduced, and cooling effect on the chip is further improved. In this case, the hollow housing structure forming the liquid mixing cavity 06 may be made of a material with a high thermal conductivity, for example, metal (aluminum, iron, or the like).

To enable the liquid medium to flow quickly between the flow channel 02*e* and the liquid mixing cavity 06, as shown in FIG. 3 and FIG. 4, the computing device 100 further includes a drive pump 09. The drive pump 09 may increase a flow rate of the liquid medium, that is, enable the liquid medium to flow quickly between the flow channel 02*e* and the liquid mixing cavity 06, to improve cooling efficiency of the chip.

Figure 5:
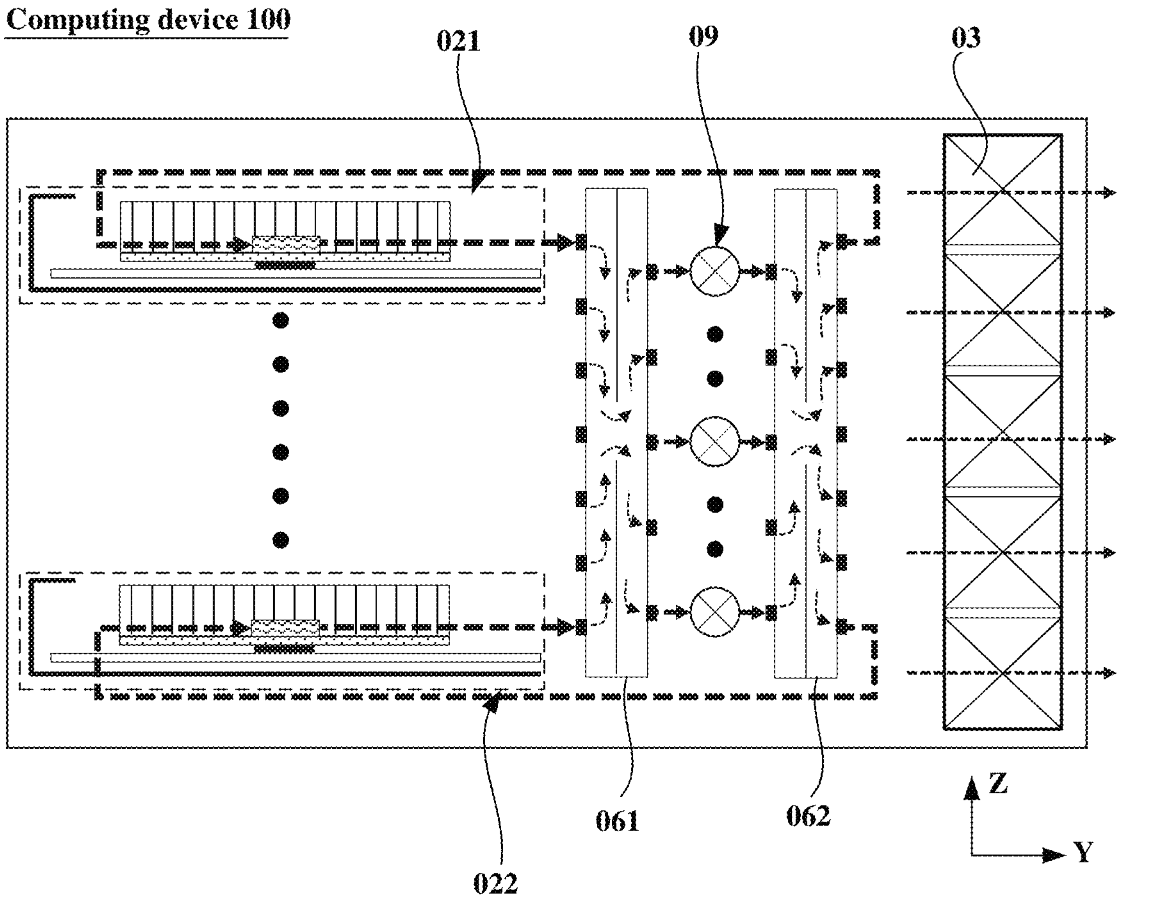
FIG. 5 is a diagram of a structure of a computing device according to an example embodiment of this application.

FIG. 5 is a diagram of a structure of another computing device 100 that includes a cooling system according to this application. In this embodiment, as shown in FIG. 5, the liquid mixing cavity 06 includes a first liquid mixing cavity 061 and a second liquid mixing cavity 062 that are communicated with each other. In other words, the computing device includes two levels of mixing, so that liquid media that have different temperatures and that enter the liquid mixing cavity can be fully mixed. This lays a good foundation for remote cooling. Certainly, more liquid mixing cavities may be disposed on the basis of FIG. 5, to implement more levels of mixing.

In addition, as shown in FIG. 5, the drive pump 09 is disposed on a communication pipe through which the first liquid mixing cavity 061 is communicated with the second liquid mixing cavity 062. Therefore, the liquid medium with a high temperature and that flows out of the flow channel 02*e* in the cooling plate assembly enters the first liquid mixing cavity 061 for mixing and cooling, and then flows through the drive pump 09 into the second liquid mixing cavity 062. That is, the liquid medium with a high temperature does not first enter the drive pump 09. In this way, the drive pump 09 is protected, and a possibility that the high-temperature liquid medium causes damage to the drive pump 09 is reduced. This can improve use performance of the drive pump 09.

In addition, in FIG. 5, a thick black dashed line with an arrow indicates a conveying path of the liquid medium between the flow channel 02*e* and the liquid mixing cavity 06. FIG. 5 is merely an example for description, and does not represent specific disposing positions of the first liquid inlet pipe 051 and the first liquid return pipe 052 through which the flow channel 02*e* is communicated with the liquid mixing cavity 06. Specific positions of the first liquid inlet pipe 051 and the first liquid return pipe 052 are not specifically limited in this application.

The following provides a plurality of different forms of structures of the cooling plate assembly 02*a*, and the following provides explanations and descriptions one by one with reference to the accompanying drawings.

Figure 6:
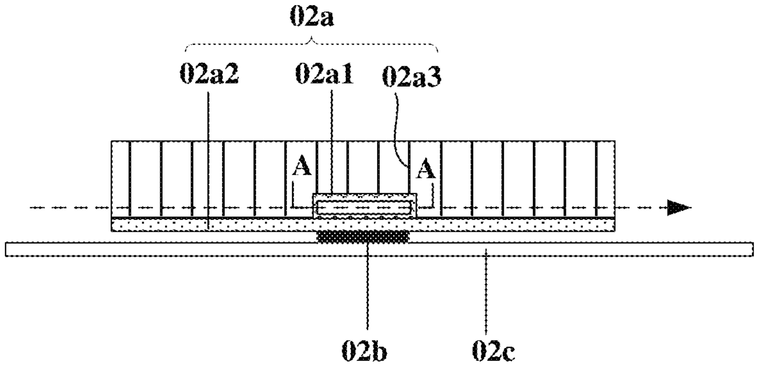
FIG. 6 is a diagram of a structure of a cooling module in a computing device according to an example embodiment of this application.

FIG. 6 is a diagram of a structure of the cooling plate assembly 02*a* according to an embodiment of this application. Specifically, the cooling plate assembly 02*a* includes a cooling plate 02*a*1, a vapor chamber 02*a*2, and a plurality of first cooling fins 02*a*3. The vapor chamber 02*a*2 is disposed on a side that is of the chip 02*b* and that is away from the circuit board 02*c*. The cooling plate 02*a*1 is disposed on a side that is of the vapor chamber 02*a*2 and that is away from the chip 02*b*. The plurality of first cooling fins 02*a*3 are disposed on a side surface that is of the cooling plate 02*a*1 and that is away from the vapor chamber 02*a*2 and a side surface that is of the vapor chamber 02*a*2 and that is away from the chip 02*b*. In addition, the flow channel 02*e* for the liquid medium to flow is formed in the cooling plate 02*a*1.

A transfer path of heat released by the chip 02*b* shown in FIG. 6 is as follows: The heat dissipated by the chip 02*b* is transferred to the vapor chamber 02*a*2, the vapor chamber 02*a*2 diffuses the heat to a larger cooling area, and then the heat existing after temperature equalization is transferred into the cooling plate 02*a*1. Some heat is taken away by using the liquid medium in the flow channel of the cooling plate 02*a*1, and some heat is diffused by using the plurality of first cooling fins 02*a*3.

In some implementations, the vapor chamber 02*a*2 may be a plate structure, for example, a copper plate, an aluminum plate, or another plate. In some other implementations, a heat pipe structure may be disposed in the plate structure, to form the vapor chamber 02*a*2. Alternatively, in some other implementations. Vapor chamber (VC) may be used as a vapor chamber structure. In other words, an implementable structure of the vapor chamber is not specially limited in this application, provided that the vapor chamber has temperature equalization effect.

Figure 7:
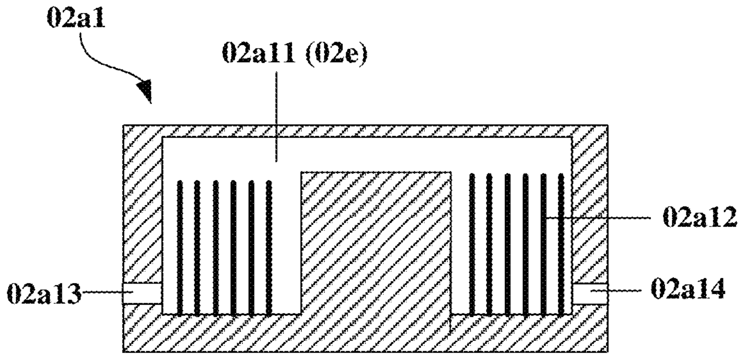
FIG. 7 is a diagram of a structure of a cold plate in a computing device according to an example embodiment of this application.

FIG. 7 is a diagram of a structure of the cooling plate 02*a*1. The structure is a diagram along A-A in FIG. 6. A specific structure is shown in FIG. 7. The cooling plate 02*a*1 is a cold plate structure. A liquid accommodating cavity 02*a*11 is formed in the cold plate. A plurality of second cooling fins 02*a*12 are disposed in the liquid accommodating cavity 02*a*11. The liquid accommodating cavity 02*a*11 forms the flow channel 02*e* for the liquid medium to flow. In addition, a first opening 02*a*13 and a second opening 02*a*14 that are communicated with the liquid accommodating cavity 02*a*11 are further provided on a wall surface of the cooling plate 02*a*1. One opening of the first opening 02*a*13 and the second opening 02*a*14 is communicated with the liquid mixing cavity 06 through the first liquid inlet pipe 051 shown in FIG. 4. The other opening of the first opening 02*a*13 and the second opening 02*a*14 is communicated with the liquid mixing cavity 06 through the first liquid return pipe 052 shown in FIG. 4.

It should be noted that, FIG. 7 shows that the liquid accommodating cavity 02*a*11 forming the flow channel 02*e* is of a U-shaped structure, or certainly may be of another structure. This is not specifically limited herein. When the liquid accommodating cavity 02*a*11 in the cold plate is of the U-shaped structure, as shown in FIG. 7, to increase the conveying path of the liquid medium in the liquid accommodating cavity 02*a*11, the first opening 02*a*13 and the second opening 02*a*14 may be provided on a protruding side edge of the U-shaped structure.

It may be learned from the structure of the cooling plate 02*a*1 shown in FIG. 7 that, the liquid accommodating cavity 02*a*11 in the cooling plate 02*a*1 conveys the liquid medium, and the plurality of second cooling fins 02*a*12 located in the liquid accommodating cavity 02*a*11 can diffuse the heat diffused by the flowing liquid medium. This further improves cooling effect on the chip.

Refer to FIG. 6. In this embodiment, an orthographic projection of the chip 02*b* on the vapor chamber 02*a*2 is located within an edge of the vapor chamber 02*a*2. That is, an area of the chip 02*b* is less than an area of the vapor chamber 02*a*2. In this way, the vapor chamber 02*a*2 can diffuse heat dissipated by the chip 02*b*, so that the vapor chamber 02*a*2 has temperature equalization effect.

Still refer to FIG. 6. An orthographic projection of the cooling plate 02*a*1 on the vapor chamber 02*a*2 is located within an edge of the vapor chamber 02*a*2. That is, an area of the cooling plate 02*a*1 is less than an area of the vapor chamber 02*a*2. Because the area of the cooling plate 02*a*1 is less than the area of the vapor chamber 02*a*2, the cooling plate 02*a*1 does not cover an entire surface of the vapor chamber 02*a*2, but covers only a part of the surface. In this implementation, as shown in FIG. 6, a side surface that is of the vapor chamber 02*a*2 and that is away from the chip 02*b* and a side surface that is of the cooling plate 02*a*1 and that is away from the vapor chamber 02*a*2 are each provided with a plurality of first cooling fins 02*a*3 at intervals. On the basis of ensuring that some heat dissipated by the chip 02*b* can be conducted to the outside via the liquid medium, a transfer path of local cooling can be shortened, so that the plurality of first cooling fins 02*a*3 fully play a local cooling function. In addition, because the plurality of first cooling fins 02*a*3 fully play a local cooling function, a flow requirement of the liquid medium can be minimized on the basis that the cooling plate 02*a*1 diffuses the heat of the chip 02*b* to the liquid mixing cavity 06. This reduces a requirement for the drive pump 09, reduces implementation difficulty of the cooling system, and reduces costs.

Figure 8:
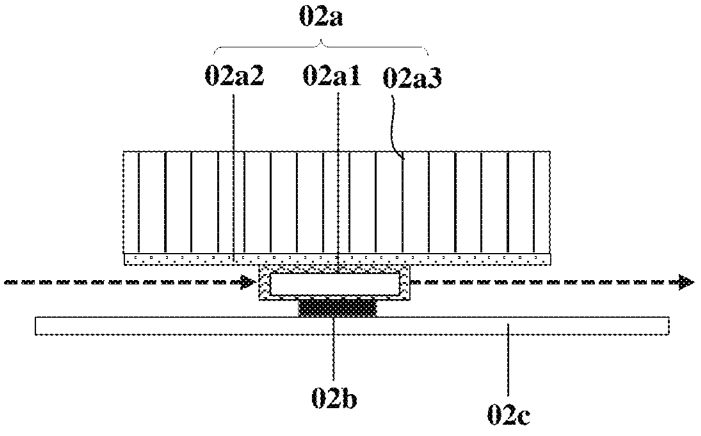
FIG. 8 is a diagram of a structure of a cooling module in a computing device according to an example embodiment of this application.

FIG. 8 is a diagram of a structure of another cooling plate assembly 02*a* according to an embodiment of this application. The cooling plate assembly 02*a* shown in FIG. 8 also includes a cooling plate 02*a*1, a vapor chamber 02*a*2, and a plurality of first cooling fins 02*a*3. The flow channel 02*e* is formed in the cooling plate 02*a*1. The cooling plate 02*a*1 may also use the cold plate structure shown in FIG. 7, or certainly may use another cooling plate structure.

The cooling plate assembly 02*a* shown in FIG. 8 and the cooling plate assembly 02*a* shown in FIG. 6 structurally differ in that: In FIG. 8, the cooling plate 02*a*1 is disposed closer to the chip 02*b* than the vapor chamber 02*a*2, the vapor chamber 02*a*2 is disposed on a side that is of the cooling plate 02*a*1 and that is away from the chip 02*b*, and the plurality of first cooling fins 02*a*3 are disposed on a surface that is of the vapor chamber 02*a*2 and that is away from the cooling plate **02*a*1. In some optional embodiments, as shown in FIG. 8, orthographic projections of the chip 02*b* and the cooling plate 02*a*1 on the vapor chamber 02*a*2 may be both located within an edge of the vapor chamber 02*a*2. That is, an area of the chip 02*b* and an area of the cooling plate 02*a*1 are both less than an area of the vapor chamber 02*a*2. In this way, the vapor chamber 02*a*2 may be large enough to dispose plentiful enough first cooling fins 02*a*3. Similarly, the plurality of first cooling fins 02*a*3** can make full use of an advantage of local cooling.

Figure 9:
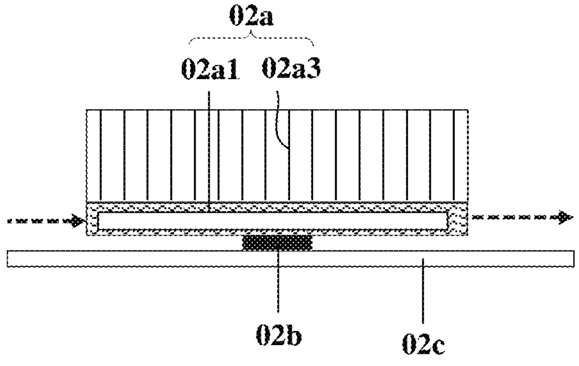
FIG. 9 is a diagram of a structure of a cooling module in a computing device according to an example embodiment of this application.

FIG. 9 is a diagram of a structure of still another cooling plate assembly **02*a* according to an embodiment of this application. The cooling plate assembly 02*a* shown in FIG. 9 includes a cooling plate 02*a*1 and a plurality of first cooling fins 02*a*3. The cooling plate 02*a*1 is disposed on a side that is of the chip 02*b* and that is away from the circuit board 02*c*. The plurality of first cooling fins 02*a*3 are disposed on a side surface that is of the cooling plate 02*a*1 and that is away from the chip 02*b*. The flow channel 02*e* is also formed in the cooling plate 02*a*1. The cooling plate 02*a*1 may alternatively use a structure shown in FIG. 7**, or certainly may use another structure.

The three cooling plate assemblies **02*a* of different structures are provided above. The cooling plate assembly 02*a* can implement local cooling, and can also transfer, to the outside via the flowing liquid medium, some heat dissipated by the chip, to further implement remote cooling. Certainly, in some implementations, a cooling plate assembly structure different from those of the foregoing three cooling plate assemblies 02*a*** may be selected.

Refer to FIG. 6, FIG. 8, and FIG. 9 together. Regardless of whether the vapor chamber **02*a*2 is disposed close to the chip 02*b* or the cooling plate 02*a*1 is disposed close to the chip 02*b*, to reduce thermal resistance, a thermal interface material (TIM) layer may be formed on a surface that is of the chip 02*b* and that is away from the circuit board 02*c*. For example, when the vapor chamber 02*a*2 is closer to the chip 02*b* than the cooling plate 02*a*1, the thermal interface material layer may be disposed on an interface that is of the chip 02*b* and that is in contact with the vapor chamber 02*a*2, to reduce thermal resistance between the chip 02*b* and the vapor chamber 02*a*2**, so that plentiful heat is diffused.

Figure 10:
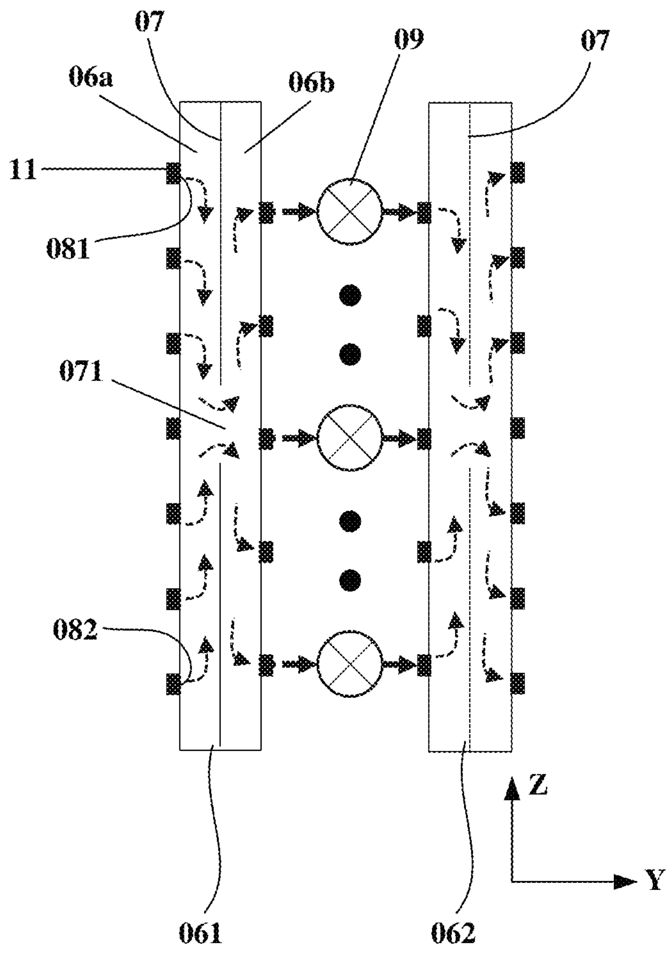
FIG. 10 is a diagram of a structure of a liquid mixing cavity in a computing device according to an example embodiment of this application.

After liquid media in different boards flow into the liquid mixing cavity 06, to enable the liquid media with different temperatures to be fully mixed, a partition plate may be disposed in the liquid mixing cavity. The partition plate divides the liquid mixing cavity into a plurality of communicated channels. For example, as shown in FIG. 10, a partition plate 07 is disposed in each of the first liquid mixing cavity 061 and the second liquid mixing cavity 062. The partition plate 07 in the first liquid mixing cavity 061 divides a channel **06*a* and a channel 06*b* that are communicated with each other. Similarly, the partition plate 07 in the second liquid mixing cavity 062 also divides a channel 06*a* and a channel 06*b*** that are communicated with each other. In this way, a conveying path of the liquid medium in the liquid mixing cavity may be increased, so that the liquid medium flowing into the liquid mixing cavity is fully mixed, and temperature equalization effect on different chips is better.

Still as shown in FIG. 10, a first liquid inlet 081 and a second liquid inlet 082 are provided on a side wall of the first liquid mixing cavity 061. The first liquid inlet 081 is communicated with the flow channel in the first board 021 in FIG. 5. The second liquid inlet 082 is communicated with the flow channel in the second board 022 in FIG. 5. Because the first board 021 and the second board 022 are arranged in the preset direction Z, the first liquid inlet 081 and the second liquid inlet 082 in FIG. 10 are also correspondingly arranged in the preset direction Z. Therefore, in an optional embodiment, as shown in FIG. 10, the partition plate 07 disposed in the first liquid mixing cavity 061 may extend in the preset direction Z, the partition plate 07 is provided with a liquid-through hole 071 through which the channel **06*a* is communicated with the channel 06*b*, and the liquid-through hole 071 is located between the first liquid inlet 081 and the second liquid inlet 082. In this way, for example, when the chip in the first board 021 is a high-power-consumption chip, and the chip in the second board 022 is a low-power-consumption chip, the high-temperature liquid medium output by the first board 021 enters the channel 06*a* through the first liquid inlet 081 and flows downward, the low-temperature liquid medium output by the second board 022 enters the channel 06*a* through the second liquid inlet 082 and flows upward, and then the two liquid media with different temperatures enter the channel 06*b* through the liquid-through hole 071**.

Refer to FIG. 10. A quantity of liquid inlets of the first liquid mixing cavity 061 is greater than a quantity of liquid outlets. The liquid inlet of the first liquid mixing cavity 061 is a liquid inlet communicated with the flow channel. The liquid outlet of the first liquid mixing cavity 061 is a liquid outlet communicated with the second liquid mixing cavity 062. An objective of such a design is as follows: Because the drive pump 09 is installed on the communication pipe between the first liquid mixing cavity 061 and the second liquid mixing cavity 062, the quantity of liquid outlets of the first liquid mixing cavity 061 is designed to be less than the quantity of liquid inlets of the first liquid mixing cavity 061, so that a quantity of drive pumps 09 can be correspondingly reduced. In this way, space occupied by the drive pump can be reduced, manufacturing costs can be further reduced, and power consumption of the entire computing device can be reduced.

In some implementations, a liquid cooling connector may be installed at a liquid inlet of the liquid mixing cavity. For example, in FIG. 10, a liquid cooling connector 11 may be installed at the first liquid inlet 081, and a liquid cooling connector 11 may also be installed at the second liquid inlet 082. In other words, the liquid mixing cavity is communicated with the pipe through the liquid cooling connector 11 in a pluggable manner. This facilitates process installation and subsequent maintenance. In some other implementations, the pipe may alternatively be fastened at the liquid inlet.

Figure 11:
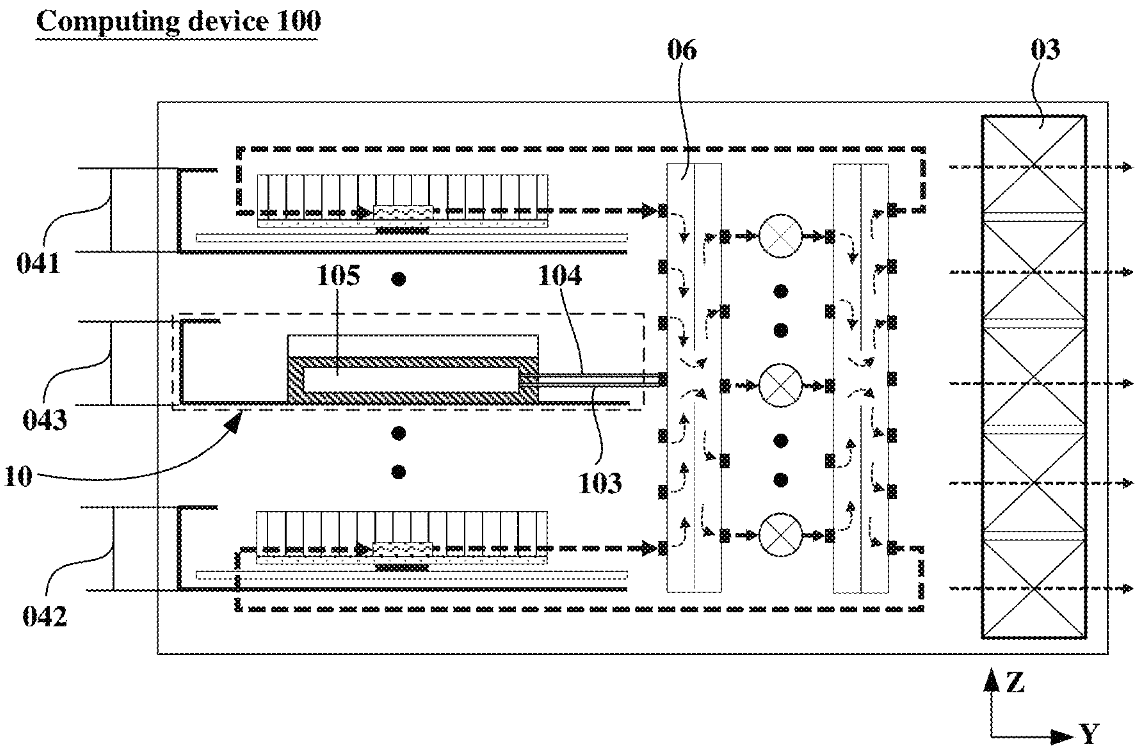
FIG. 11 is a diagram of a structure of a computing device according to an example embodiment of this application.

When the computing device is in the non-full configuration scenario, the chassis has a slot in which no board is inserted. For example, in a diagram of a structure of the computing device 100 shown in FIG. 11, boards are inserted into both the first slot 041 and the second slot 042, but no board is inserted into the third slot 043. To make full use of a cooling capability of another slot, as shown in FIG. 11, a heat exchange module 10 may be disposed in the third slot 043 in which no board is inserted. The heat exchange module 10 may diffuse heat dissipated by the first board 021 and the second board 022. This improves cooling efficiency.

Figure 12:
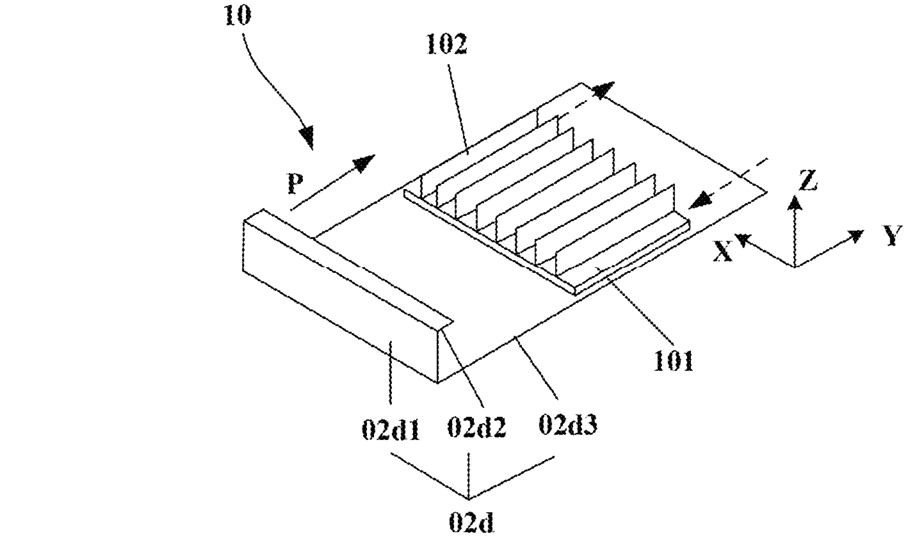
FIG. 12 is a diagram of a structure of a heat exchange module of a computing device according to an example embodiment of this application.

FIG. 12 is a diagram of an implementable structure of the heat exchange module 10. Refer to FIG. 11 and FIG. 12 together. The heat exchange module 10 includes a heat exchange plate 101. A fluid cavity 105 is formed in the heat exchange plate 101. The fluid cavity 105 is communicated with the liquid mixing cavity 06 through a second liquid outlet pipe 103 and a second liquid return pipe 104. In this way, the liquid medium in the liquid mixing cavity 06 may further flow into the fluid cavity 105 in the heat exchange plate 101, that is, cooling is performed by using space of the third slot. Therefore, cooling of the first board 021 and the second board 022 is not limited to space of the first slot 041 and space of the second slot 042, and space of the idle third slot 043 is also used. That is, space in the entire chassis can be fully utilized. The cooling capability is not wasted, a rotation speed requirement for the fan 03 can be lowered, and system cooling power consumption is reduced.

The heat exchange plate 101 in the heat exchange module 10 in the foregoing embodiment may use the structure of the cooling plate **02*a*1 shown in FIG. 7. The plurality of second cooling fins 02*a*12 in the cooling plate 02*a*1 may further cool the liquid medium flowing in the cooling plate 02*a*1. This further improves cooling efficiency of the first board 021 and the second board 022**.

It may be understood that the heat exchange module 10 disposed in the third slot 043 in this embodiment of this application functions. For example, for the first board 021 with high power consumption, remote cooling includes at least two cooling paths. One is remote cooling performed by using the cooling plate assembly in the second board 022, and the other is remote cooling performed by using the heat exchange module 10.

To further improve cooling efficiency of the heat exchange module 10, as shown in FIG. 12, the heat exchange module 10 further includes a plurality of third cooling fins 102. The plurality of third cooling fins 102 are arranged on the heat exchange plate 101 at intervals. In this way, the liquid medium conveyed to the fluid cavity 105 of the heat exchange plate 101 may be further cooled by using the plurality of third cooling fins 102.

In addition, as shown in FIG. 12, the heat exchange module 10 further includes a mounting plate **02*d*. The heat exchange plate 101 is fastened to the mounting plate 02*d*. The mounting plate 02*d* is disposed in the third slot 043 in a pluggable manner. If a board needs to be disposed in the third slot 043, the heat exchange module 10 may be removed, and then the board is inserted into the third slot 043. In this way, the heat exchange module 10** may be flexibly and freely installed according to a use scenario.

The mounting plate **02*d* that supports and fastens the heat exchange plate 101 has a plurality of implementable structures. For example. FIG. 12 shows an embodiment. In this embodiment, the mounting plate 02*d* includes a first plate 02*d*3, a connection plate 02*d*1, and a second plate 02*d*2. The second plate 02*d*2 and the first plate 02*d*3 are parallel to a plug-in direction (a direction P shown in FIG. 12) of the heat exchange module 10. The direction P is a direction Y from the front to the rear of the chassis 01 in FIG. 2. The connection plate 02*d*1 is perpendicular to the plug-in direction of the heat exchange module 10, and is fastened to the second plate 02*d*2 and the first plate 02*d*3. In addition, the heat exchange plate 101 is fastened to a side that is of the first plate 02*d*3 and that faces the second plate 02*d*2. In some other implementations, the mounting plate 02*d*** may alternatively use another structure.

For the structure of the mounting plate **02*d* shown in FIG. 12, during specific implementation, the connection plate 02*d*1 of the heat exchange module 10 inserted into the third slot 043 is located at a slot opening of the slot, and can seal the slot opening, to prevent sundries from entering the third slot. In addition, the connection plate 02*d*1** that seals the slot opening can play an electromagnetic shielding role, and suppress external electromagnetic waves from entering the slot and interfering with running of the chip.

In the computing device 100 shown in FIG. 3, FIG. 5, and FIG. 11, the drive pump 09 is located inside the chassis 01, and is located outside the slot. That is, the drive pump 09 does not occupy extra space of an outer cabinet, and is convenient to subsequently maintain.

When the drive pump 09 is located outside the slot, each board may be correspondingly connected to one drive pump, or may be correspondingly connected to a plurality of drive pumps connected in series. For example, in FIG. 3, one board is correspondingly connected to one drive pump. In addition, in some embodiments, as shown in FIG. 5, a plurality of boards may be correspondingly connected to one drive pump. In other words, one drive pump is configured to drive liquid media in the plurality of boards to flow. A connection mode of the drive pump is merely limited, or may be another connection mode.

Figure 13:
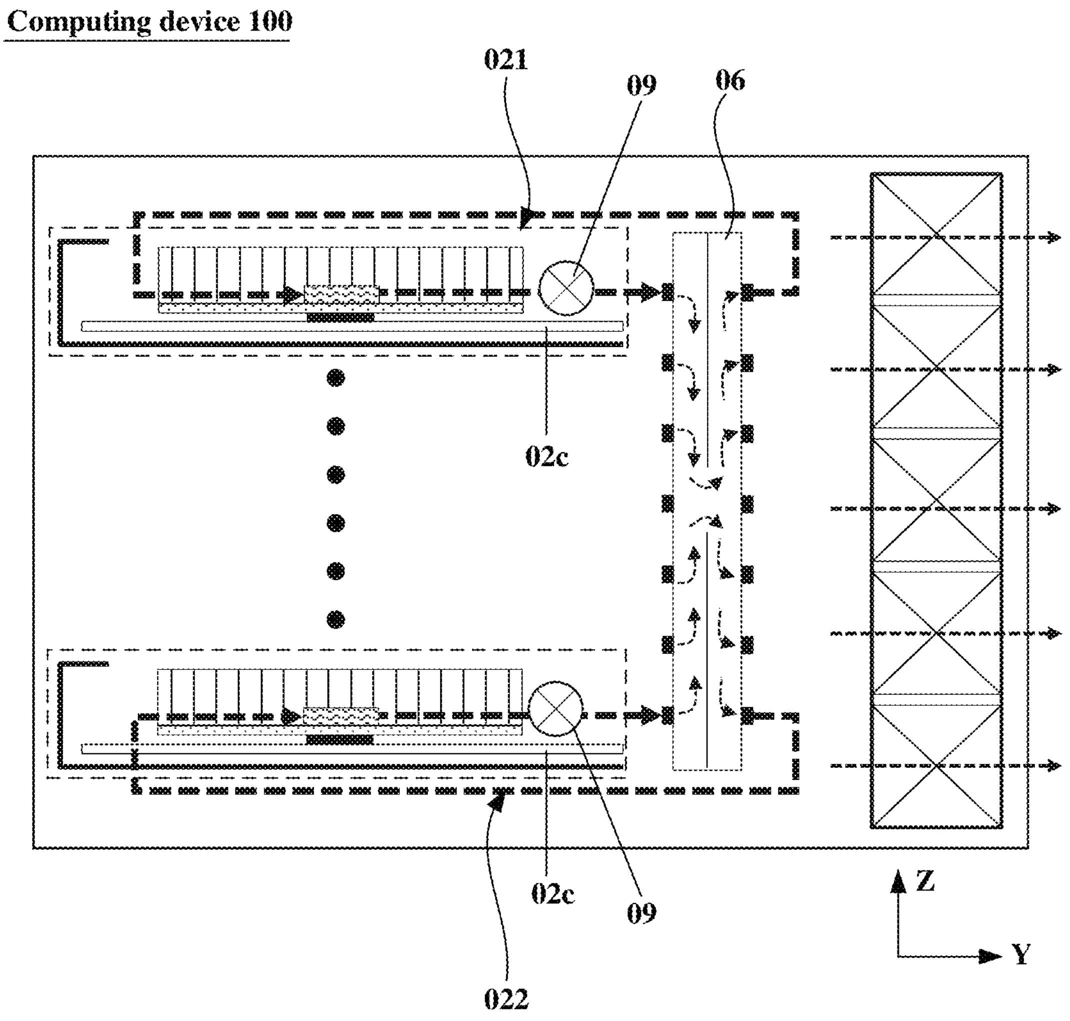
FIG. 13 is a diagram of a structure of a computing device according to an example embodiment of this application.

FIG. 13 shows a diagram of a structure of another computing device 100. This embodiment differs from the foregoing embodiment in that a drive pump 09 is disposed in a slot and disposed on a circuit board **02*c*, and in other words, a chip, a cooling plate assembly, and the drive pump are all integrated on the circuit board 02*c***.

In the computing device 100 shown in FIG. 3, FIG. 5, FIG. 11, and FIG. 13, the liquid mixing cavity 06 is disposed inside the chassis 01. In a diagram of a structure of still another computing device 100 shown in FIG. 14, a liquid mixing cavity 06 is installed outside a chassis 01, that is, located inside an outer cabinet, and a drive pump 09 is located inside the chassis 01 and disposed on a circuit board **02*c***.

Figure 14:
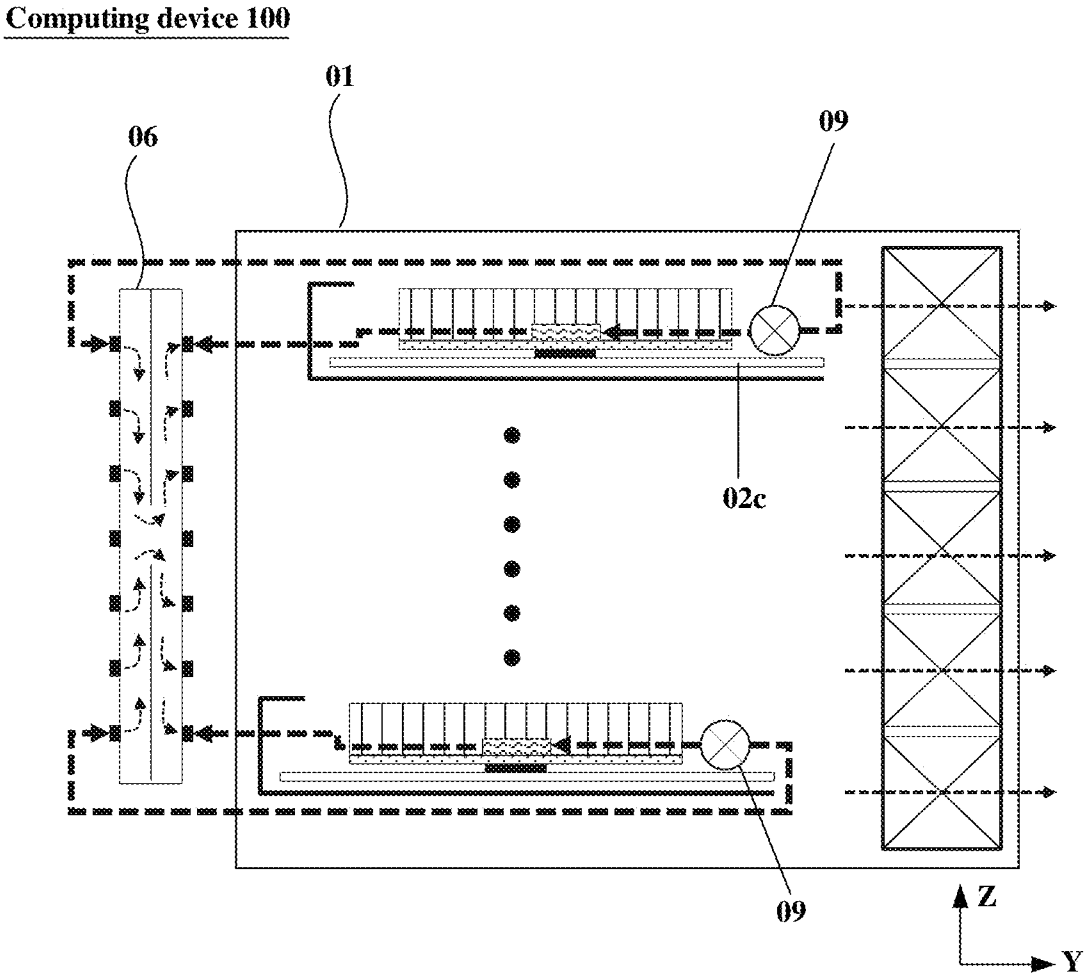
FIG. 14 is a diagram of a structure of a computing device according to an example embodiment of this application.

In the computing device 100 shown in FIG. 14, the drive pump 09 is disposed on a pipe for a liquid medium to flow back. In other words, a high-temperature liquid medium flowing out of a board passes through the liquid mixing cavity 06, and then flows through the drive pump 09 back to the board. In this way, impact of the high-temperature liquid medium on performance of the drive pump can be avoided. In the implementation structures of the foregoing different computing devices, similarly, the drive pump may alternatively be disposed on the pipe for the liquid medium to flow back.

Figure 15:
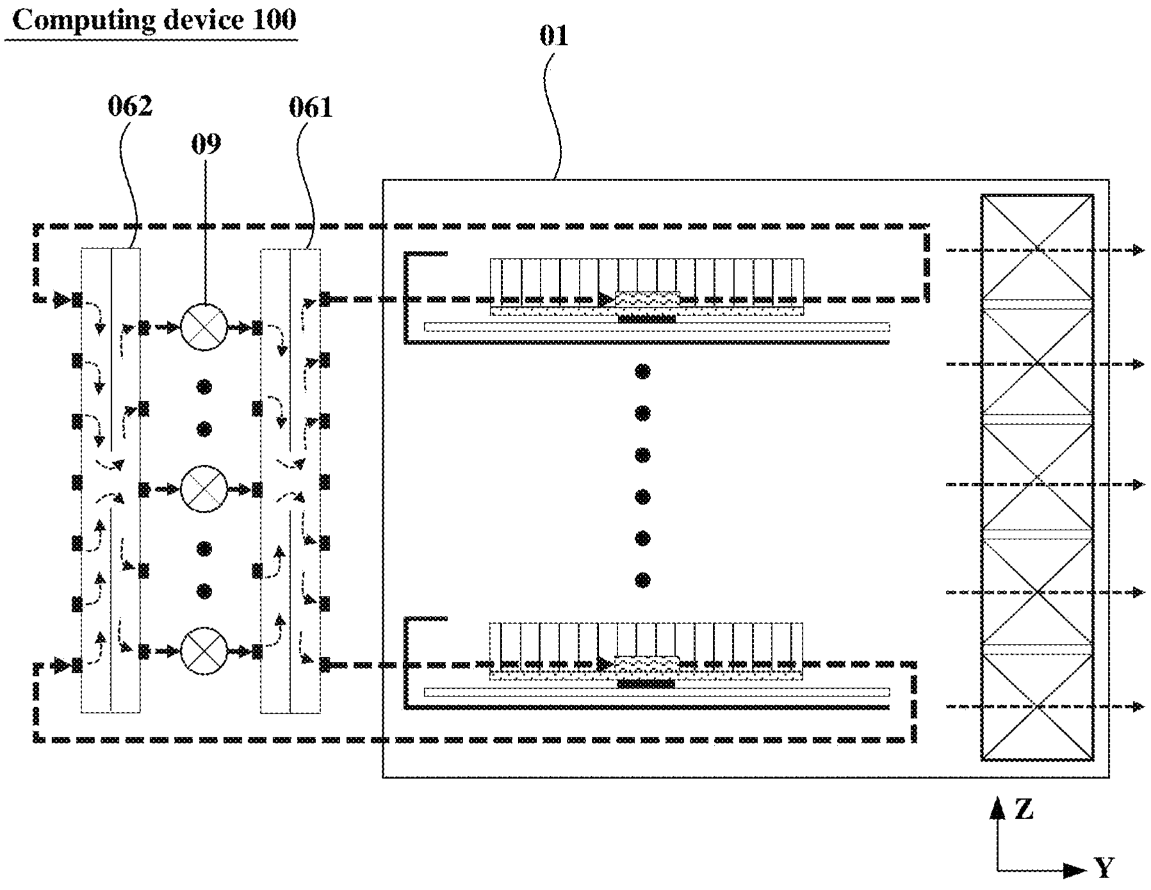
FIG. 15 is a diagram of a structure of a computing device according to an example embodiment of this application.

FIG. 15 further shows a diagram of a structure of a computing device 100. FIG. 15 shows a first liquid mixing cavity 061 and a second liquid mixing cavity 062 that are communicated with each other. Both the first liquid mixing cavity 061 and the second liquid mixing cavity 062 are disposed outside the chassis 01, and the drive pump 09 is also disposed outside the chassis 01.

In some embodiments, if there are a plurality of liquid mixing cavities, some liquid mixing cavities may be disposed inside the chassis 01, and some liquid mixing cavities may be disposed outside the chassis 01. A disposing position of the liquid mixing cavity may be determined based on an actual requirement, for example, may be determined based on accommodating space inside the chassis 01.

In the computing device 100, a plurality of boards 02 are installed, and another circuit board structure is also disposed and electrically connected to the boards 02.

Figure 16:
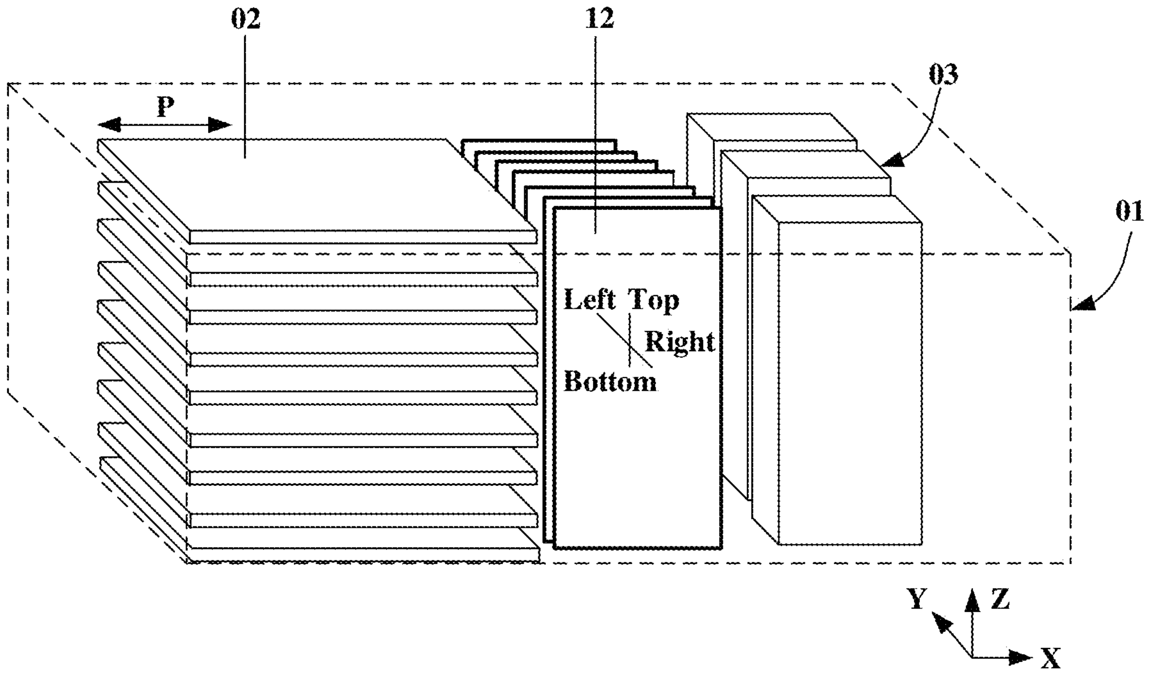
FIG. 16 is a diagram of a structure of a computing device according to an example embodiment of this application.
Figure 17:
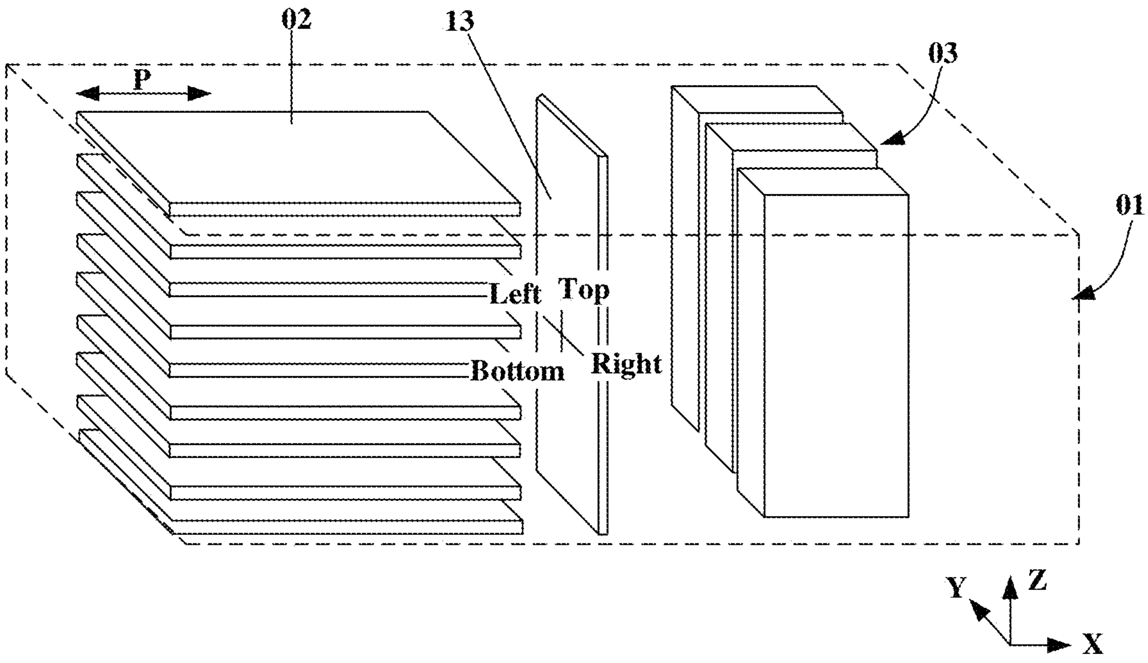
FIG. 17 is a diagram of a structure of a computing device according to an example embodiment of this application.

FIG. 16 and FIG. 17 show two diagrams of a structure that includes a board 02, another circuit board, and the foregoing cooling system. In FIG. 16, in addition to a plurality of boards 02 and a fan 03, a chassis 01 further includes a plurality of first circuit boards 12. The plurality of boards 02 are arranged in a direction Z in FIG. 16. The plurality of first circuit boards 12 are arranged in a direction Y perpendicular to the direction Z. Each first circuit board 12 is parallel to a plug-in and plug-out direction P of the board 02. The plurality of boards 02 are electrically connected to the plurality of first circuit boards 12. For example, the board 02 may be electrically connected to the first circuit board 12 through a connector. Such a structure may be referred to as an orthogonal architecture of the computing device.

In FIG. 17, in addition to a plurality of boards 02 and a fan 03, a chassis 01 further includes a plurality of second circuit boards 13. The plurality of boards 02 are arranged in a direction Z in FIG. 17. The plurality of second circuit boards 13 are arranged in a direction X perpendicular to the direction Z. Each second circuit board 13 is perpendicular to a plug-in and plug-out direction P of the board 02. The plurality of boards 02 are electrically connected to the plurality of second circuit boards 13. Such a structure may be referred to as a front-inserted back plate architecture of the computing device. FIG. 17 shows an example of a second circuit board 13.

In FIG. 16 and FIG. 17, a position of a liquid mixing cavity is not limited. For example, in the orthogonal architecture in FIG. 16, the liquid mixing cavity may be disposed above, below, on the right, or on the left of the plurality of first circuit boards 12, or may be disposed at another position. Similarly, in FIG. 17, the liquid mixing cavity may be disposed above, below, on the right, or on the left of the plurality of second circuit boards 13, or may be disposed at another position.

In the descriptions of this specification, specific features, structures, materials, or characteristics may be combined in a proper manner in any one or more of embodiments or examples.

The foregoing descriptions are specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A cooling module configured to cool a chip in a computing device, the cooling module comprising:
- a liquid mixing cavity;
- a first cooling plate; and
- a second cooling plate, wherein
  - the first cooling plate is configured to be disposed on a side of a first chip,
  - the second cooling plate is configured to be disposed on a side of a second chip,
  - a temperature of the first chip is unequal to a temperature of the second chip,
  - a flow channel is provided in each of the first cooling plate and the second cooling plate,
  - the first cooling plate and the second cooling plate are each provided with a liquid outlet and a liquid return opening communicating with the flow channel,
  - the liquid outlet and the liquid return opening communicate with the liquid mixing cavity, and
  - a liquid medium flows between the flow channel and the liquid mixing cavity.

2. The cooling module according to claim 1, further comprising:
- at least one drive pump, wherein
- the flow channel in either of the first cooling plate and the second cooling plate communicates with the liquid mixing cavity through the drive pump.

3. The cooling module according to claim 1, wherein
- a partition plate is configured to be disposed in the liquid mixing cavity, and
- the partition plate divides the liquid mixing cavity into at least two communication channels.

4. The cooling module according to claim 3, wherein
- the first cooling plate and the second cooling plate are arranged in a first direction,
- a first liquid inlet and a second liquid inlet communicating with the liquid mixing cavity are provided on a wall surface of the liquid mixing cavity,
- the first liquid inlet and the second liquid inlet are arranged in the first direction,
- the first liquid inlet communicates with a liquid outlet of the first cooling plate,
- the second liquid inlet communicates with a liquid outlet of the second cooling plate,
- the partition plate extends in the first direction,
- a liquid-through hole, through which two adjacent channels communicate with each other, is provided in the partition plate, and
- the liquid-through hole is provided at a position between the first liquid inlet and the second liquid inlet.

5. The cooling module according to claim 1, wherein
- the liquid mixing cavity comprises a first liquid mixing cavity and a second liquid mixing cavity,
- the first liquid mixing cavity communicates with the liquid outlet,
- the second liquid mixing cavity communicates with the liquid return opening, and
- the first liquid mixing cavity and the second liquid mixing cavity communicate with each other through communication pipes.

6. The cooling module according to claim 5, wherein
- in the first liquid mixing cavity, a quantity of liquid inlets configured to communicate with the flow channel is greater than a quantity of liquid outlets configured to communicate with the second liquid mixing cavity,
- the cooling module further comprises a plurality of drive pumps, and
- any one of the communication pipes communicates with one of the plurality of drive pumps.

7. The cooling module according to claim 1, further comprising:
- a first vapor chamber, wherein
  - the first vapor chamber is disposed closer to the first chip than the first cooling plate, and
  - the first cooling plate is disposed on a side surface of the first vapor chamber away from the first chip.

8. The cooling module according to claim 7, wherein
- an orthographic projection of the first cooling plate on the first vapor chamber is located within an edge of the first vapor chamber, and
- the side surface of the first vapor chamber away from the first chip, and a side surface of the first cooling plate away from the first vapor chamber, are each provided with a plurality of first cooling fins at intervals.

9. The cooling module according to claim 1, further comprising:
- a first vapor chamber, wherein
  - the first cooling plate is disposed closer to the first chip than the first vapor chamber,
  - the first vapor chamber is disposed on a side surface of the first cooling plate away from the first chip, and
  - a side surface of the first vapor chamber away from the first cooling plate is provided with a plurality of first cooling fins at intervals.

10. A computing device, comprising:
a chassis;
a first chip;
a second chip; and
a cooling module, wherein
the first chip and the second chip are disposed inside the chassis,
the first cooling plate is disposed on a side of the first chip and is fastened to the first chip,
the second cooling plate is disposed on a side of the second chip and is fastened to the second chip, and
the cooling module comprises:
a liquid mixing cavity;
a first cooling plate; and
a second cooling plate, wherein
the first cooling plate is configured to be disposed on a side of a first chip,
the second cooling plate is configured to be disposed on a side of a second chip,
a temperature of the first chip is unequal to a temperature of the second chip,
a flow channel is provided in each of the first cooling plate and the second cooling plate,
the first cooling plate and the second cooling plate are each provided with a liquid outlet and a liquid return opening communicating with the flow channel,
the liquid outlet and the liquid return opening communicate with the liquid mixing cavity, and
a liquid medium flows between the flow channel and the liquid mixing cavity.

11. The computing device according to claim 10, wherein the cooling module further comprises:
at least one drive pump, wherein
the flow channel in either of the first cooling plate and the second cooling plate communicates with the liquid mixing cavity through the drive pump.

12. The computing device according to claim 10, wherein
a partition plate is configured to be disposed in the liquid mixing cavity, and
the partition plate divides the liquid mixing cavity into at least two communication channels.

13. The computing device according to claim 12, wherein
the first cooling plate and the second cooling plate are arranged in a first direction,
a first liquid inlet and a second liquid inlet communicating with the liquid mixing cavity are provided on a wall surface of the liquid mixing cavity,
the first liquid inlet and the second liquid inlet are arranged in the first direction,
the first liquid inlet communicates with a liquid outlet of the first cooling plate, and
the second liquid inlet communicates with a liquid outlet of the second cooling plate,
the partition plate extends in the first direction,
a liquid-through hole, through which two adjacent channels communicates with each other, is provided in the partition plate, and
the liquid-through hole is provided at a position between the first liquid inlet and the second liquid inlet.

14. The computing device according to claim 10, wherein
the liquid mixing cavity comprises a first liquid mixing cavity and a second liquid mixing cavity,
the first liquid mixing cavity communicates with the liquid outlet,
the second liquid mixing cavity communicates with the liquid return opening, and
the first liquid mixing cavity and the second liquid mixing cavity communicates with each other through communication pipes.

15. The computing device according to claim 14, wherein
in the first liquid mixing cavity, a quantity of liquid inlets configured to communicate with the flow channel is greater than a quantity of liquid outlets configured to communicate with the second liquid mixing cavity,
the cooling module further comprises a plurality of drive pumps, and
any one of the communication pipes communicates with one of the plurality of drive pumps.

16. The computing device according to claim 10, wherein the cooling module further comprises:
a first vapor chamber, wherein
the first vapor chamber is disposed closer to the first chip than the first cooling plate, and
the first cooling plate is disposed on a side surface of the first vapor chamber away from the first chip.

17. The computing device according to claim 16, wherein
an orthographic projection of the first cooling plate on the first vapor chamber is located within an edge of the first vapor chamber, and
the side surface of the first vapor chamber away from the first chip, and a side surface of the first cooling plate away from the first vapor chamber, are each provided with a plurality of first cooling fins at intervals.

18. The computing device according to claim 10, wherein the cooling module further comprises:
a first vapor chamber, wherein
the first cooling plate is disposed closer to the first chip than the first vapor chamber,
the first vapor chamber is disposed on a side surface of the first cooling plate away from the first chip, and
a side surface of the first vapor chamber away from the first cooling plate is provided with a plurality of first cooling fins at intervals.

19. The computing device according to claim 10, wherein
the liquid mixing cavity is disposed inside or outside the chassis.

20. The computing device according to claim 10, wherein
the chassis is provided with a first slot and a second slot,
the first chip and the first cooling plate are disposed in the first slot in a pluggable manner, and
the second chip and the second cooling plate are disposed in the second slot in the pluggable manner.

* * * * *